(12) United States Patent
Pollack et al.

(10) Patent No.: US 6,219,395 B1
(45) Date of Patent: Apr. 17, 2001

(54) PHASE ALIGNMENT OF FRAMES IN COMPUTER TELEPHONY BUSSES

(75) Inventors: Jonathan D. Pollack, Portland, ME (US); Charles C. Linton, Southboro, MA (US)

(73) Assignee: Natural MicroSystems, Corp., Framingham, MA (US)

( * ) Notice: Subject to any disclaimer, the term of this patent is extended or adjusted under 35 U.S.C. 154(b) by 0 days.

(21) Appl. No.: 08/931,218

(22) Filed: Sep. 16, 1997

(51) Int. Cl.[7] .............................. H04L 7/00; H03L 7/06
(52) U.S. Cl. ............................................. 375/371; 327/156
(58) Field of Search ..................................... 375/371, 373, 375/375, 376; 327/156, 155, 147, 145, 144, 146; 331/48; 329/325, 323, 360

(56) References Cited

U.S. PATENT DOCUMENTS

| | | | |
|---|---|---|---|
| 4,546,486 | * 10/1985 | Evans | 375/374 |
| 4,573,017 | * 2/1986 | Levine | 327/114 |
| 4,972,442 | * 11/1990 | Steierman | 375/357 |
| 5,040,190 | * 8/1991 | Smith et al. | 375/214 |
| 5,668,830 | * 9/1997 | Georgion et al. | 375/220 |

* cited by examiner

*Primary Examiner*—Chi Pham
*Assistant Examiner*—Khai Tran
(74) *Attorney, Agent, or Firm*—Shane H. Hunter; Mintz, Levin, Cohn, Ferris, Glovsky, and Popeo, PC

(57) ABSTRACT

A communication bus interface circuit includes a local frame signal generator responsive to a device clock signal and having a local bus frame signal output. A synchronization loss detector is responsive to the local frame signal output and to a bus frame signal input. A clock adjuster is responsive to the synchronization loss detector and to the device clock signal to adjust the local frame signal generator until synchronization between the bus frame signal and the local frame signal is established.

27 Claims, 2 Drawing Sheets

PHASE ALIGNMENT OF FRAMES IN COMPUTER TELEPHONY BUSSES

FIELD OF THE INVENTION

The invention relates to circuits and methods for phase alignment of frames in computer telephony busses.

BACKGROUND OF THE INVENTION

Computer telephony is based on digital communication across time division multiplexed serial data lines, known as "streams." A typical computer telephony bus provides 16 or more streams, which each have between 32 and 128 timeslots. The timeslots in the streams all occur at the same time because the streams are synchronized with reference to a single bit called the "frame pulse."

Circuits that interface with the bus must also be synchronized to the clocks present on the bus to ensure that the data transferred between the circuit and the bus have the same frequency as the data on the bus. But frequency lock does not ensure that the timeslots in the bus are lined up with events in interface. In such a situation, the interface frame and the bus frame are considered to be "frequency locked, but not phase aligned."

Upon power-up and initialization of an entire system, an interface circuit that interfaces with the bus, such as a digital switch, will generally be both frequency locked and phase aligned. During the course of operation, however, it is possible for a new clock circuit to assume the role of "master," and take on the role of establishing the clocking and frame synchronization. When this happens, the circuit may remain frequency locked, relative to the new clock master but lose phase alignment. It is possible to reinitialize the circuit to again achieve synchronization, but this can take time and result in data loss.

SUMMARY OF THE INVENTION

In one general aspect, the invention features a communication bus interface circuit that includes a local frame signal generator responsive to a device clock signal and having a local bus frame signal output. A synchronization loss detector is responsive to the local frame signal output and to a bus frame signal input, and a clock adjuster is responsive to the synchronization loss detector and to the device clock signal to adjust the local frame signal generator until synchronization between the bus frame signal and the local frame signal is established.

In preferred embodiments, the clock adjuster includes output lines for providing an add or a subtract signal or both an on/off and an add/subtract signal to the local bus frame signal generator. The clock adjuster can include an offset measurement circuit responsive to the bus frame signal input and to the local frame signal output for measuring a timing difference between the bus frame signal and the local frame signal and the local frame signal generator can operate by either adding a clock cycle to the device clock or subtracting a device clock cycle from the local frame signal length depending on the measure of the timing difference. The clock adjuster can be constructed and adapted to adjust the clock over several bus frame signal periods, the local bus frame signal generator can also be responsive to a power-up reset circuit, and the clock generation circuit can include a counter having a load input and an enable input responsive to the clock adjuster.

In another general aspect, the invention features a bus frame signal input and a local frame signal generator having a local frame signal output. A synchronization loss detector is responsive to the local bus frame signal output of the bus frame signal generator and to the bus frame signal input, and a frame signal length modulator is responsive to the synchronization loss detector for causing the local frame signal generator to adjust the length of the local frame signal on its local frame signal output until synchronization between the bus frame signal input and the local frame signal is established.

In preferred embodiments, the modulator includes an output line for providing an add signal to the local bus frame signal generator to shorten the local bus frame signal, or the modulator includes an output line for providing a subtract signal to the local bus frame signal generator to lengthen the local bus frame signal. The modulator can include an offset measurement circuit responsive to the bus frame signal input and to the local frame signal for measuring a timing difference between the bus frame signal and the local frame signal and the local frame signal generator can provide either an add signal or a subtract signal to the local bus frame signal generator depending on the measure of the timing difference. The local bus frame signal generator can also be responsive to a power-up reset circuit.

In a further general aspect, the invention features a communications bus interface method that includes receiving a bus frame signal, generating a local frame signal output based on the bus frame signal, detecting a loss of synchronization between the bus frame signal and the local frame signal, and modulating the length of the local frame signal to establish synchronization between the bus frame signal and the local frame signal over several local bus frame signal periods.

In preferred embodiments, the step of adjusting the device clock signal operates by adding or subtracting a device clock cycle from a device clock signal. The method can also include detecting a measure of a timing difference between the bus frame signal and the local frame signal and the step of modulating can operate by either adding a device clock cycle to the local frame signal length or subtracting a device clock cycle from the local frame signal length depending on the measure of the timing difference.

Systems according to the invention can be advantageous in that they may permit a circuit that interfaces with the bus to return to phase alignment while minimizing data errors. Since a fraction of a bit time, such as a single cycle of a device clock, is removed or added from the frame length in one frame time, the frames can align gradually. This can take place faster than if the interface circuit were to be reset altogether, and can reduce or eliminate the side effects of communications errors. This is particularly important in low-latency systems which carry audio, video, or other time-sensitive information.

DESCRIPTION OF AN ILLUSTRATIVE EMBODIMENT

Figure 1:
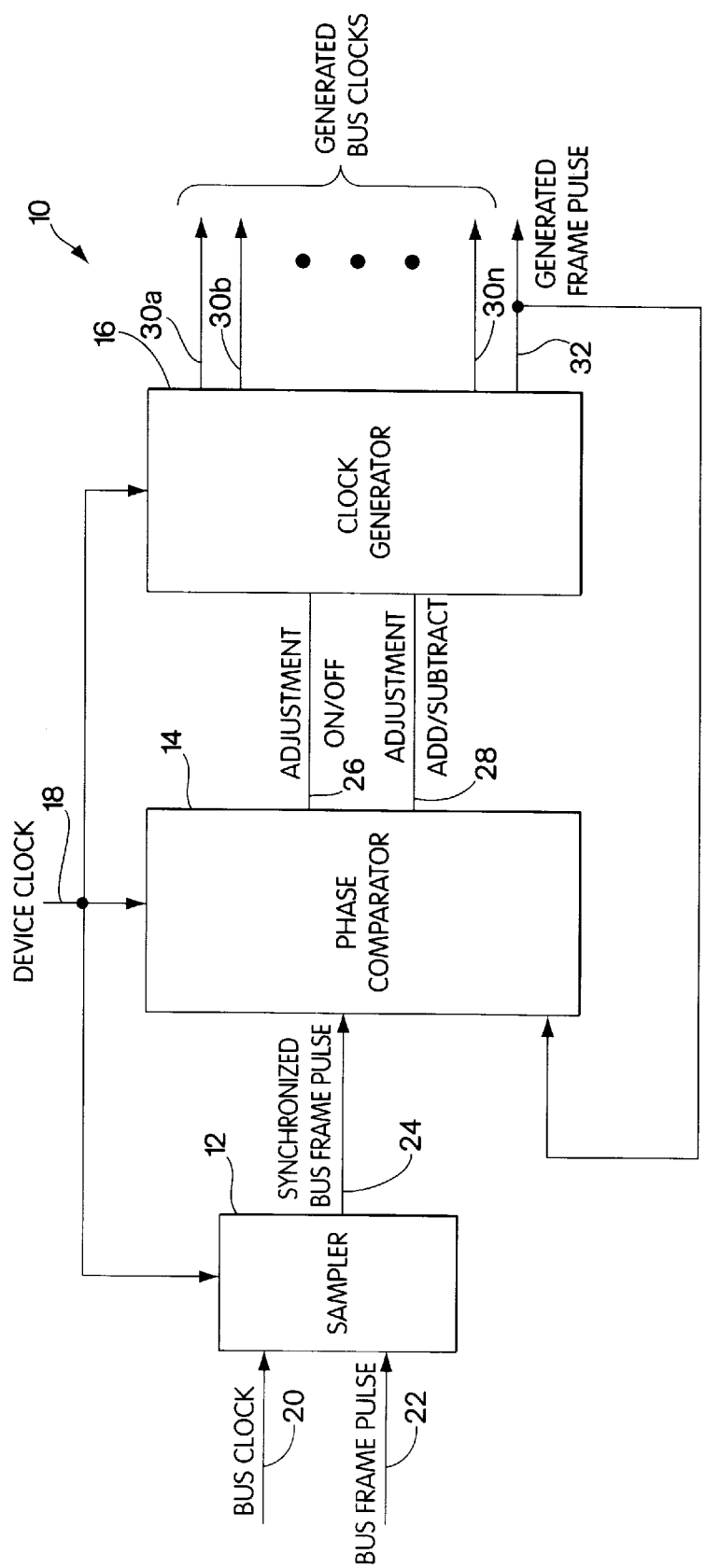
FIG. 1 is a block diagram of a phase alignment circuit according to the invention.

Referring to FIG. 1, a phase alignment circuit 10 according to the invention includes a sampler 12, a phase comparator 14, and a clock generator 16, which each have clock inputs to receive a device clock line 18. The sampler has inputs operatively connected to a bus clock line 20 and a bus frame pulse line 22 of a time division multiplexed bus such as a computer telephony bus. The sampler has a frame pulse output, which provides a synchronized bus frame pulse on a bus frame pulse line 24 to an input of the phase comparator.

The phase comparator 14 has a generated frame pulse input that receives a generated frame pulse from a generated frame pulse output line 32 of the clock generator 16. It also has an adjustment on/off output line 26 provided to an input of the clock generator and an adjustment add/subtract line 28 provided to another input of the clock generator. The clock generator 16 has a series of generated local bus clock outputs 30a, 30b, . . . 30n.

The device clock is a utility clock that is used to clock the logic circuits that perform the functions of the circuit. It is preferable for the device frequency to be a binary-integer multiple of the highest generated bus clock frequency. For example, if the highest bus frequency is 16.348 MHZ then the device clock could be 32.768 MHZ or 65.536 MHZ. With a frame pulse frequency of 8 KHz there would be 4096 or 8192 device clock cycles per frame.

In operation, the sampler 12 synchronizes the incoming clock and frame pulses with the device clock, to place the generated signals on the same time reference as the incoming signals, and passes the resulting synchronized frame signal to the phase comparator 14. The phase comparator performs two functions. Its first function is to make a basic on/off decision. If the center of the synchronized bus frame pulse and the center of the generated bus frame (22) pulse occur within the same device clock cycle, then no adjustment is necessary and the phase comparator establishes the "off" condition by providing an indication to the clock generator.

If the center of the synchronized bus frame pulse and the center of the generated bus frame pulse occur within different device clock cycles, then the phase comparator establishes the "on" condition and determines whether the "add" or "subtract" conditions are to be established. If the generated frame pulse occurs more than half-way through the bus frame, then the phase comparator establishes the "add" condition by providing an add signal to the clock generator. If the generated frame pulse occurs at the half-way mark or before, then the phase comparator establishes the "subtract" condition by providing a subtract signal to the clock generator.

It is possible to omit the second function of the phase comparator. Such a system will only generate a single on/off signal to the clock generator. When the clock generator receives the "on" signal, it will either add or subtract depending on how it was configured. Such a system has the advantage of being simpler to implement, but it can take as much as twice as long to achieve phase alignment.

The clock generator 16 produces a number of clocks of prescribed frequencies for use by the circuit that the phase alignment circuit is connected to (e.g., a digital telephony switch). If the phase comparator has set the "on" condition, then the clock generator will lengthen the frame by one device clock cycle for the add condition, or shorten the frame by one device clock cycle for the subtract condition. In the "add" condition, the generated bus clocks will be slightly longer until they reach alignment with the bus, and in the "subtract" condition, the generated bus clocks will be slightly shorter until they reach synchronization with the bus. When the phase comparator 14 detects synchronization, it establishes the "off" condition and the clock generator generates local bus clocks in sync with the time division multiplexed bus.

Figure 2:
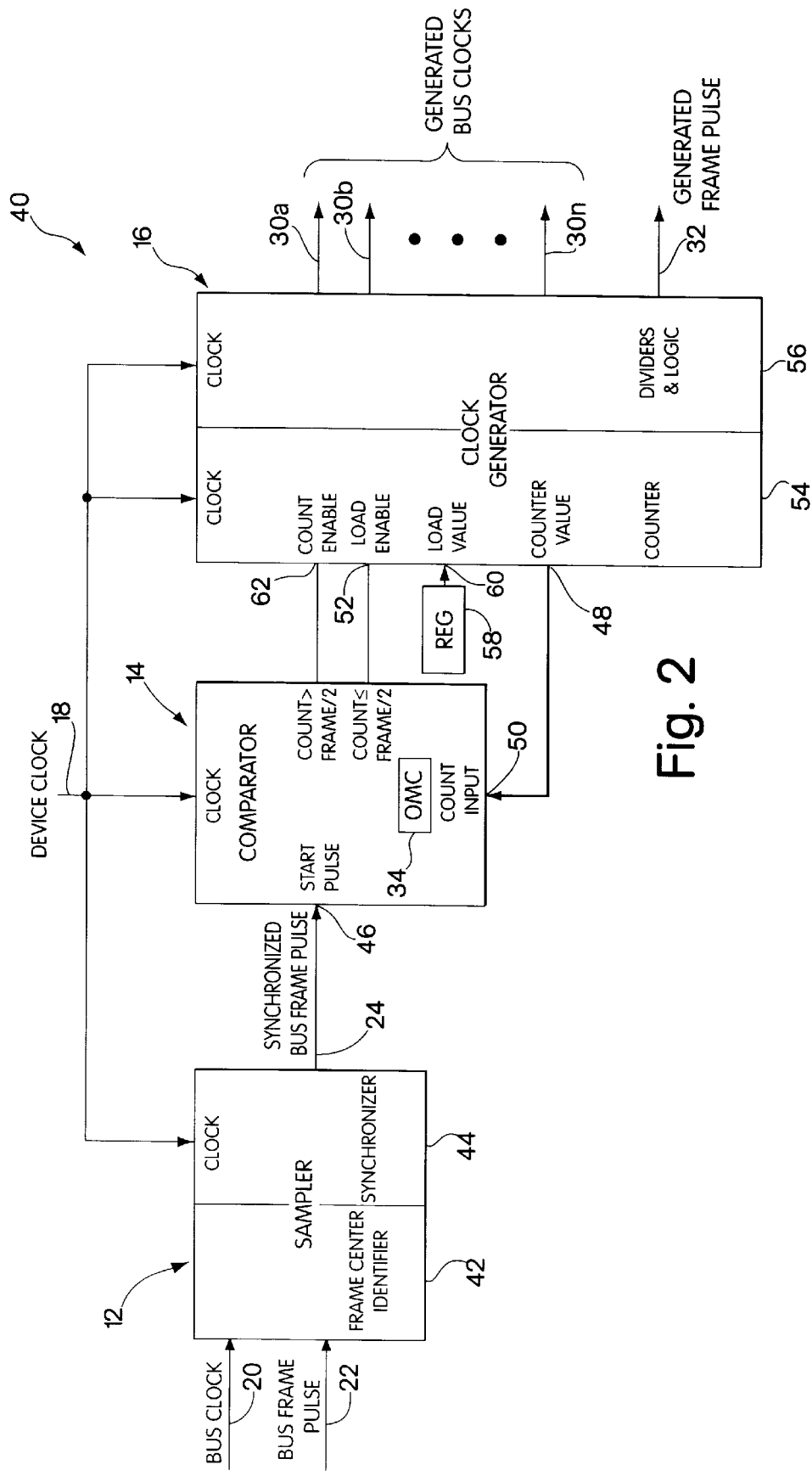
FIG. 2 is a block diagram of a possible implementation of the circuit of FIG. 1.

Referring to FIG. 2, in a possible implementation of the phase alignment circuit, the sampler 12 is separated into two portions, a frame center identification portion 42 and a synchronizer 44. The frame center identification portion identifies the bus frame center to the synchronizer. The synchronizer then generates a pulse at the center of the bus frame pulse synchronized to the device clock, and provides this frame center pulse to a start pulse input 46 of the comparator 14.

The clock generator 16 is made up of a counter 54 and a series of dividers and logic 56. The counter has a counter value output 48 that provides a count value to a count input 50 of the comparator 14. The comparator, in particular an offset measurement circuit (OMC) 34, tests this count value when it receives the frame center pulse, and if the count value is less or equal to one-half of a frame, it determines that the frame is late. The comparator in particular the OMC, responds to this determination by providing a load enable output signal to a load enable input 52 of the counter of the clock generator. This causes the counter to load the contents of a register 58 into the counter through a load input 60 at a specific time during the frame. The loaded value is selected to move the counter ahead of its count at that time by one clock signal.

If the comparator 14 determines that the count value is greater than one-half of a frame, the comparator provides a disable signal on a count enable input 62 of the counter 54, which disables it for one clock cycle. This allows the incoming frame to "catch up," by lengthening the generated frame by one clock cycle. When the clock generator is in phase with the synchronized bus frame pulse, the count enable input will remain high and the load enable input will remain low, allowing the counter to operate normally. If desired, the circuit can be further simplified by using only one direction (i.e., lengthen only or shorten only).

The present invention has now been described in connection with a number of specific embodiments thereof. However, numerous modifications which are contemplated as falling within the scope of the present invention should now be apparent to those skilled in the art. Therefore, it is intended that the scope of the present invention be limited only by the scope of the claims appended hereto. In addition, the order of presentation of the claims should not be construed to limit the scope of any particular claim term.

What is claimed is:

1. A communication bus interface circuit, comprising:
 a bus frame signal input configured to receive a bus frame signal,
 a local frame signal generator responsive to a device clock signal, having a device clock cycle, and providing a local frame signal indicative of a local frame, the local frame signal generator being configured to adjust a length of the local frame by a device clock cycle in response to an adjust signal,
 a synchronization loss detector responsive to the local frame signal of the local frame signal generator and to the bus frame signal, and
 a clock adjuster responsive to the synchronization loss detector and to the device clock signal for providing the adjust signal to adjust the local frame signal generator until synchronization between the bus frame signal and the local frame signal is established.

2. The circuit of claim 1 wherein the clock adjuster includes an output line for providing an add signal to the local frame signal generator.

3. The circuit of claim 1 wherein the clock adjuster includes an output line for providing a subtract signal to the local frame signal generator.

4. The circuit of claim 1 wherein the clock adjuster includes output lines for providing an add/subtract signal to the local frame signal generator.

5. The circuit of claim 1 wherein the clock adjuster includes at least one output line for providing on/off and add/subtract signals to the local frame signal generator.

6. The circuit of claim 1 wherein the clock adjuster further includes an offset measurement circuit responsive to the bus frame signal and to the local frame signal for measuring a timing difference between the bus frame signal and the local frame signal and wherein the local frame signal generator operates by either adding a device clock cycle to the local frame or subtracting a device clock cycle from the local frame depending on the measure of the timing difference.

7. The circuit of claim 6 wherein the clock adjuster is constructed and adapted to adjust the local frame signal over several bus frame signal periods.

8. The circuit of claim 1 wherein the local frame signal generator is also responsive to a power-up reset circuit.

9. The circuit of claim 1 wherein the local frame generator includes a counter having a load input and an enable input responsive to the clock adjuster.

10. The circuit of claim 1 wherein the local frame signal generator is configured to adjust the length of the local frame by one device cycle per local frame signal period.

11. A communication bus interface circuit, comprising:
a bus frame signal input configured to carry a bus frame signal,
a local frame signal generator responsive to a device clock and providing a local frame signal on a local frame signal output,
a synchronization loss detector responsive to the local frame signal of the local frame signal generator and to the bus frame signal input, and
a frame signal length modulator responsive to the synchronization loss detector for causing the local frame signal generator to adjust a length of the local frame on its local frame signal output by a device clock cycle of the device clock until synchronization between the bus frame signal and the local frame signal is established.

12. The circuit of claim 11 wherein the modulator includes an output line for providing an add signal to the local frame signal generator to lengthen a local frame of the local bus frame signal.

13. The circuit of claim 11 wherein the modulator includes an output line for providing a subtract signal to the local frame signal generator to shorten a local frame of the local bus frame signal.

14. The circuit of claim 11 wherein the modulator includes an offset measurement circuit responsive to the bus frame signal and to the local frame signal for measuring a timing difference between the bus frame signal and the local frame signal and wherein the local frame signal generator provides either an add signal or a subtract signal to the local frame signal generator depending on the measure of the timing difference.

15. The circuit of claim 11 wherein the local frame signal generator is also responsive to a power-up reset circuit.

16. A communications bus interface circuit, comprising:
means for receiving a bus frame signal,
means for generating a local frame signal, indicative of a local frame, based on a bus frame signal and a device clock signal, the generating means configured to adjust a length of the local frame by a cycle of the device clock signal in response to an adjust signal,
means for detecting a loss of synchronization between the bus frame signal and the local frame signal, and
means for providing the adjust signal to cause adjusting of the local frame signal to establish synchronization between the bus frame signal and the local frame signal.

17. The circuit of claim 16 wherein the means for adjusting the local frame signal operates by subtracting a device clock cycle from the local frame signal.

18. The circuit of claim 16 wherein the means for adjusting the local frame signal operates by adding a device clock cycle to the local frame signal.

19. The circuit of claim 16 further including the means for detecting a measure of a timing difference between the bus frame signal and the local frame signal and wherein the means for providing operates by either adding a device clock cycle to the local frame or subtracting a device clock cycle from the local frame depending on the measure of the timing difference.

20. The circuit of claim 16 wherein the means for adjusting the local frame signal adjusts the local frame signal over several local frame signal periods.

21. A communications bus interface method, comprising:
receiving a bus frame signal, generating a local frame signal, indicative of a local frame, based on the bus frame signal, detecting a loss of synchronization between the bus frame signal and the local frame signal, and modulating, over at least one local frame signal period, a length of the local frame by one device clock cycle per local frame signal period to attempt to establish synchronization between the bus frame signal and the local frame signal.

22. The method of claim 21 wherein modulating the local frame signal operates by subtracting a device clock cycle from the local frame signal.

23. The method of claim 21 wherein modulating the local frame signal operates by adding a device clock cycle to the local frame signal.

24. The method of claim 21 further including detecting a measure of a timing difference between the bus frame signal and the local frame signal and wherein the modulating operates by either adding a device clock cycle to the local frame signal or subtracting a device clock cycle from the local frame signal depending on the measure of the timing difference.

25. A communication bus interface circuit comprising:
a bus frame signal input configured to carry a bus frame signal,
a local frame signal generator responsive to a device clock signal, having a device clock cycle, the generator providing a local frame signal indicative of a local frame, the generator being configured to adjust a length of the local frame by a device clock cycle in response to an adjust signal, and
a clock adjuster responsive to the device clock signal for providing the adjust signal to adjust the local frame signal generator until synchronization between the bus frame signal and the local frame signal is established.

26. The circuit of claim 25 further comprising a synchronization loss detector responsive to the local frame signal and the bus frame signal and configured to provide an enable signal, wherein the clock adjuster is responsive to the enable signal and is configured to provide the adjust signal dependent on the enable signal.

27. A communication bus interface circuit comprising:
a bus frame signal input configured to carry a bus frame signal,
a local frame signal generator responsive to a device clock signal derived from the bus frame signal, having a device clock cycle, the generator providing a local frame signal indicative of a local frame, the generator being configured to adjust a length of the local frame in response to an adjust signal, and
a clock adjuster responsive to the device clock signal for providing the adjust signal to adjust the local frame signal generator to attempt to obtain synchronization between the bus frame signal and the local frame signal.

* * * * *